United States Patent
Nunan et al.

(10) Patent No.: US 6,747,338 B1
(45) Date of Patent: Jun. 8, 2004

(54) COMPOSITE DIELECTRIC WITH IMPROVED ETCH SELECTIVITY FOR HIGH VOLTAGE MEMS STRUCTURES

(75) Inventors: Thomas K. Nunan, Carlisle, MA (US); David E. Grosjean, Holliston, MA (US); Denis M. O'Kane, Somerville, MA (US); James S. Sellars, Beverly, MA (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 10/306,639

(22) Filed: Nov. 27, 2002

(51) Int. Cl.[7] ............................................... H01L 23/58
(52) U.S. Cl. ..................... 257/640; 257/660; 257/634; 257/635; 438/791
(58) Field of Search .............................. 257/760, 506, 257/640, 374, 649; 438/724, 744, 757, 791, 954

(56) References Cited

U.S. PATENT DOCUMENTS

| | | | |
|---|---|---|---|
| 5,847,454 A | 12/1998 | Shaw et al. | 257/734 |
| 6,051,511 A * | 4/2000 | Thakur et al. | 438/791 |
| 6,051,866 A | 4/2000 | Shaw et al. | 257/417 |
| 6,121,148 A | 9/2000 | Bashir et al. | 438/692 |
| 6,342,430 B1 | 1/2002 | Adams et al. | 438/424 |
| 6,380,606 B1 | 4/2002 | Brady et al. | 257/506 |
| 6,392,313 B1 | 5/2002 | Epstein et al. | 290/52 |

* cited by examiner

Primary Examiner—Dung A. Le
(74) Attorney, Agent, or Firm—Weingarten, Schurgin, Gagnebin & Lebovici LLP (57) ABSTRACT

A method of manufacturing MEMS structures and devices that allows the fabrication of dielectric structures with improved etch selectivity and good electrical leakage characteristics. The dielectric structure includes a composite stack of silicon nitride sub-layers with a silicon-rich nitride sub-layer and a stoichiometric silicon nitride sub-layer at opposite ends of the stack. Alternatively, the dielectric structure includes a single silicon nitride layer providing a graded change in silicon content through the dielectric layer, from silicon-rich nitride to stoichiometric silicon nitride.

15 Claims, 5 Drawing Sheets

COMPOSITE DIELECTRIC WITH IMPROVED ETCH SELECTIVITY FOR HIGH VOLTAGE MEMS STRUCTURES

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to semiconductor fabrication processes, and more specifically to a process of manufacturing semiconductor devices including Micro Electro-Mechanical Systems (MEMS) devices that include composite dielectric structures providing improved etch selectivity and reduced electrical leakage.

In recent years, MEMS devices have gained increased popularity in the field of microelectronics. For example, such MEMS devices may include micro-accelerometers, micro-mechanical filters, micro-resonators, micro-sensors, and micro-switches. A conventional process for manufacturing a MEMS device comprises providing a silicon substrate, forming a sacrificial oxide layer on a surface of the substrate, and patterning and etching the sacrificial oxide layer to define and expose a connection region for anchoring the MEMS device to the substrate surface. Next, a dielectric layer such as silicon nitride is deposited over the sacrificial oxide layer and the exposed anchor connection region. A polycrystalline silicon ("polysilicon") layer is then deposited over the silicon nitride layer, and the sacrificial oxide layer is etched away to release at least a portion of the polysilicon layer and the adjacent silicon nitride layer. In the conventional MEMS fabrication process, the ratio of silicon to nitrogen in the silicon nitride layer is typically the stoichiometric ratio of three parts silicon to four parts nitrogen, i.e., $Si_3N_4$. Because $Si_3N_4$ typically has very good electrical leakage characteristics, the sacrificial oxide layer can be etched and removed while assuring that the microstructure remains electrically isolated from the silicon substrate.

One drawback of the conventional MEMS fabrication process described above is that stoichiometric silicon nitride is frequently incapable of satisfying the etch selectivity requirements for a given MEMS fabrication process. For example, MEMS structures frequently require extended etch times, e.g., up to 16 hours, in Hydrofluoric (HF) acid to release the micro-structure. However, stoichiometric silicon nitride typically has reduced etch selectivity to HF acid. As a result, during long release times, the HF acid can attack the $Si_3N_4$ in the region where it is anchored to the substrate surface, thereby reducing the integrity of the anchor connection.

One way of improving the etch selectivity of stoichiometric silicon nitride to HF acid is to increase the thickness of the $Si_3N_4$ layer. However, increasing the thickness of the stoichiometric silicon nitride layer can be problematic. For example, residual stresses in the thicker $Si_3N_4$ layer can cause excessive wafer bow, micro-cracking and curling, and/or peeling from the underlying layers of the MEMS device.

In the above-described conventional MEMS fabrication process, a silicon nitride layer containing silicon in excess of the stoichiometric ratio may be employed instead of the standard stoichiometric silicon nitride. For example, such a silicon-rich nitride layer may be deposited using a Low Pressure Chemical Vapor Deposition (LPCVD) process. Because silicon-rich nitride typically has higher selectivity to oxide etch in HF acid, the sacrificial oxide layer can be etched and removed without appreciably affecting the silicon-rich nitride layer.

However, such use of silicon-rich nitride in the fabrication of MEMS devices also has drawbacks in that silicon-rich nitride frequently exhibits unacceptably high electrical leakage, especially when high voltages, i.e., greater than 40 V, are applied across the dielectric. For example, high voltage switching signals are often applied across dielectric layers included in micro-switch devices. In such devices, the electrical leakage that results from the application of high voltage switching signals (e.g., greater than 1 nA at 40 V) must typically be reduced or effectively eliminated to assure proper operation of the device.

Electrical isolation between the MEMS device and the silicon substrate can be improved by increasing the thickness of the silicon-rich nitride layer. However, even though there is typically less stress within a silicon-rich nitride layer than within an $Si_3N_4$ layer, increasing the thickness of silicon-rich nitride layers can raise manufacturing costs by reducing throughput and exacerbating maintenance requirements of the MEMS device fabrication equipment.

It would therefore be desirable to have an improved process for manufacturing MEMS structures and devices. Such an improved MEMS device manufacturing process would allow the fabrication of dielectric structures that provide enhanced etch selectivity and reduced electrical leakage. It would also be desirable to have such a MEMS device fabrication process that has minimal impact on current fabrication equipment reliability and production processing.

BRIEF SUMMARY OF THE INVENTION

In accordance with the present invention, a method of manufacturing semiconductor devices including Micro Electro-Mechanical Systems (MEMS) devices is provided that allows the fabrication of dielectric structures with improved etch selectivity, while maintaining minimal electrical leakage in the MEMS device. The dielectric structure fabricated by the presently disclosed method includes at least one silicon nitride layer that provides successively reduced silicon content from the sacrificial layer boundary toward the structural layer boundary of the MEMS structure.

In one embodiment, the method of manufacturing MEMS structures and devices includes providing a substrate, and forming a sacrificial layer on a surface of the substrate. Next, the sacrificial layer is patterned and etched to define and expose a connection region for anchoring the MEMS structure to the substrate surface. A dielectric layer is then formed over the sacrificial layer and the anchor connection region. Next, a structural layer is deposited over the dielectric layer. The sacrificial layer is then etched away to release at least a portion of the structural layer, which is anchored to the substrate surface at the connection region by the dielectric layer.

In the presently disclosed embodiment, the dielectric layer comprises a composite stack of discrete dielectric sub-layers. A first dielectric sub-layer comprising silicon-rich nitride is deposited over the sacrificial layer and the exposed anchor connection region, and at least one additional dielectric sub-layer having a reduced silicon content is formed over the silicon-rich nitride sub-layer. In a first embodiment, the additional dielectric sub-layer comprises a single stoichiometric silicon nitride sub-layer. In a second embodiment, at least two additional silicon nitride sub-layers are formed over the silicon-rich nitride sub-layer such that the silicon content of the nitride sub-layers is successively reduced from being in excess of the stoichiometric ratio, to being substantially equal to the stoichiometric ratio of standard silicon nitride.

In an alternative embodiment, the dielectric layer comprises a single dielectric layer deposited over the sacrificial layer and the exposed anchor connection region. The single dielectric layer comprises a silicon nitride layer providing a graded change in silicon content ranging from silicon-rich nitride near the sacrificial layer boundary, to stoichiometric silicon nitride near the structural layer boundary of the MEMS structure.

By fabricating a dielectric structure comprising silicon nitride having progressively reduced silicon content from the sacrificial layer boundary toward the structural layer boundary of the MEMS device, improved selectivity to the sacrificial layer etch can be achieved, while maintaining minimal electrical leakage in the device.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

Improved methods for manufacturing semiconductor devices including Micro Electro-Mechanical Systems (MEMS) devices are disclosed that allow the fabrication of dielectric structures providing enhanced etch selectivity and reduced electrical leakage. The dielectric structures fabricated by the presently disclosed methods comprise silicon nitride having progressively reduced silicon content from an adjacent sacrificial layer toward an adjacent structural layer of the MEMS device.

Figure 1:
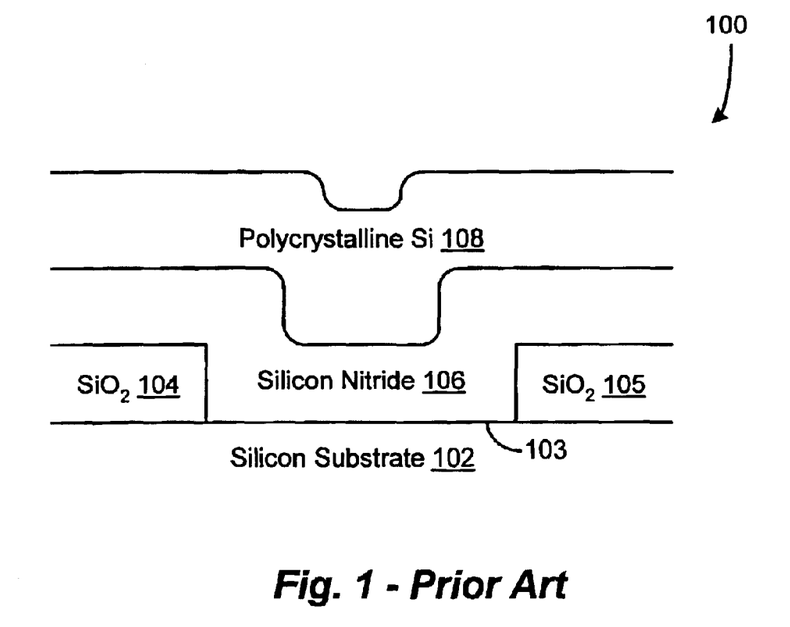
FIG. 1 is a schematic representation of a substrate, and sacrificial, dielectric, and structural layers in a conventional MEMS device.

FIG. 1 depicts a portion of a conventional MEMS device 100 including a silicon substrate 102, sacrificial layers 104–105, a dielectric layer 106, and a structural layer 108. As shown in FIG. 1, the sacrificial layers 104–105 of the MEMS device 100 comprise silicon dioxide ($SiO_2$), the dielectric layer 106 comprises silicon nitride, and the structural layer 108 comprises polycrystalline silicon ("polysilicon").

In a conventional process for manufacturing the MEMS device 100, the $SiO_2$ layers 104–105 are thermally grown from a surface of the silicon substrate 102, the silicon nitride layer 106 is formed over the $SiO_2$ layers 104–105 and an anchor connection region 103 on the substrate surface, and the polysilicon layer 108 is deposited over the silicon nitride layer 106. The $SiO_2$ layers 104–105 are then etched away in, e.g., Hydrofluoric (HF) acid to release corresponding portions of the polysilicon and silicon nitride layers 106 and 108.

In the conventional MEMS fabrication process, the silicon nitride layer 106 typically comprises either stoichiometric silicon nitride ($Si_3N_4$) or silicon-rich nitride (i.e., nitride containing silicon in excess of the stoichiometric ratio). Although stoichiometric silicon nitride generally has favorable electrical leakage characteristics, it can exhibit reduced etch selectivity to HF acid. In contrast, silicon-rich nitride has improved selectivity to HF acid, but generally provides relatively high electrical leakage.

Figure 2:
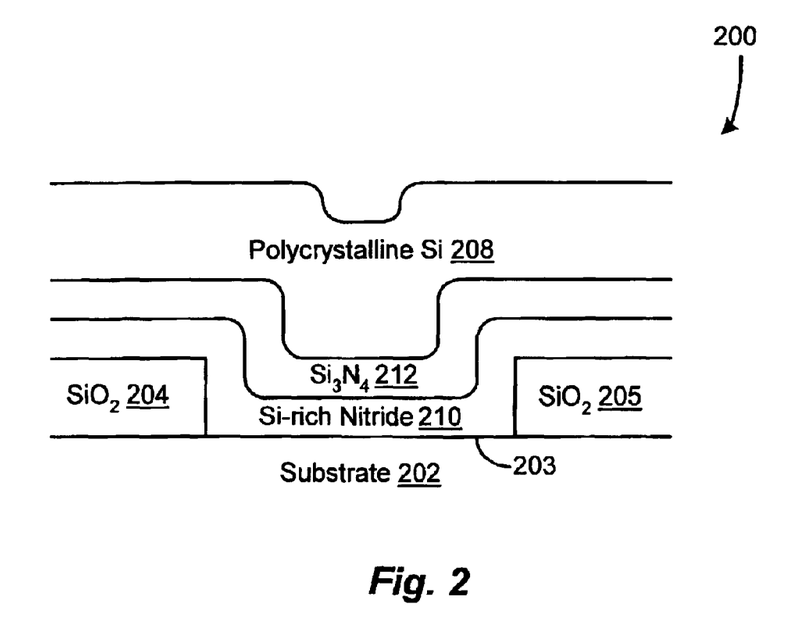
FIG. 2 is a schematic representation of a MEMS device including a dielectric structure according to the present invention.

FIG. 2 depicts a portion of an illustrative embodiment of a MEMS device 200, in accordance with the present invention. In the illustrated embodiment, the MEMS device 200 comprises a substrate 202, and a semiconductor layer structure including sacrificial layers 204–205, a dielectric layer including a composite stack having a silicon-rich nitride sub-layer 210 and a stoichiometric silicon nitride ($Si_3N_4$) sub-layer 212, and a structural layer 208. It is noted that each one of the layers 204–205, 208, 210, 212 of the MEMS device 200 may be coextensive with the layer(s) or substrate adjacent thereto, or may instead lie over or under a portion of the adjacent layer(s) or substrate.

In the preferred embodiment, the substrate 202 comprises a silicon substrate. It is understood, however, that a substrate made of any suitable material may be employed. Further, the sacrificial layers 204–205 may comprise silicon dioxide ($SiO_2$) or any other suitable sacrificial material, and the structural layer 208 may comprise polysilicon or any other suitable structural material for the MEMS device 200. The $SiO_2$ layers 204–205 and the polysilicon layer 208 may be formed by any suitable MEMS fabrication process.

As described above, the dielectric layer of the MEMS device 200 (see FIG. 2) includes the silicon-rich nitride sub-layer 210 and the stoichiometric $Si_3N_4$ sub-layer 212. Each of the silicon-rich nitride and $Si_3N_4$ sub-layers 210 and 212 may be formed from a suitable mixture of ammonia ($NH_3$) and dichlorosilane (DCS) gas, which may be mixed and deposited on the MEMS device 200 by any suitable MEMS fabrication process.

The process for manufacturing the dielectric layer including the silicon-rich nitride sub-layer 210 and the stoichiometric $Si_3N_4$ sub-layer 212 will be better understood with reference to the following illustrative example. In this example, the dielectric layer manufacturing process is per-formed using a deposition chamber (not shown) such as a standard production Low Pressure Chemical Vapor Deposition (LPCVD) nitride furnace. In order to deposit the silicon-rich nitride sub-layer 210 over the $SiO_2$ layers 204–205 and the substrate 202, the $NH_3$ and DCS gas mixture is injected into the chamber at a rate of approximately 90 cc per minute for the DCS, and a rate of approximately 18 cc per minute for the $NH_3$, thereby providing a ratio of DCS to $NH_3$ of about 5:1. Further, the temperature is maintained at approximately 800° C., and the pressure is maintained at approximately 280 mT. The silicon-rich nitride sub-layer 210 is deposited at a rate of approximately 25 Å per minute for a suitable time period to attain a thickness within a range of about 1000–5000 Å. It should be appreciated that the target deposition thickness is dependent upon amounts removed during subsequent steps in the process flow including the release step, and the desired thickness remaining.

In order to deposit the $Si_3N_4$ sub-layer 212 over the silicon-rich nitride sub-layer 210, the $NH_3$ and DCS gas mixture is injected into the chamber at a rate of approximately 150 cc per minute for the $NH_3$, and a rate of approximately 50 cc per minute for the DCS, thereby providing a ratio of $NH_3$ to DCS of about 3:1. Further, the temperature is ramped up to approximately 780° C., and the pressure is maintained at approximately 280 mT. The $Si_3N_4$ sub-layer 212 is deposited at a rate of approximately 26 Å per minute for a suitable time period to attain a thickness within a range of about 1000–5000 Å. It should be appreciated that the final thickness of the $Si_3N_4$ sub-layer 212 is sufficient to achieve minimal electrical leakage at high voltage levels.

As a result, the silicon-rich nitride sub-layer 210 has a tensile stress within the layer of approximately 300 MPa, and an etch rate (in 6:1 HF acid) of approximately 2.5 Å per minute. In contrast, the $Si_3N_4$ sub-layer 212 has a tensile stress within the layer of approximately 1000 MPa, and an etch rate (in 6:1 HF acid) of approximately 8.0 Å per minute.

Accordingly, the silicon-rich nitride sub-layer 210 (see FIG. 2), which is configured to anchor the MEMS device 200 to a connection surface 203 of the substrate 202, comprises a reduced stress nitride with high etch selectivity to the HF acid. Further, the $Si_3N_4$ sub-layer 212, which is configured for electrically isolating the micro-structure 208 from the substrate 202, provides low electrical leakage. It is noted that the ratio of silicon to nitrogen in the $Si_3N_4$ sub-layer 212 is approximately the stoichiometric ratio of 0.75, and the ratio of silicon to nitrogen in the silicon-rich nitride sub-layer 210 is approximately 0.85, which is in excess of the stoichiometric ratio. For example, the silicon to nitrogen ratios within the sub-layers of the dielectric layer may be determined by depth profiling using conventional X-ray Photoelectron Spectroscopy (XPS) techniques.

Figure 3:
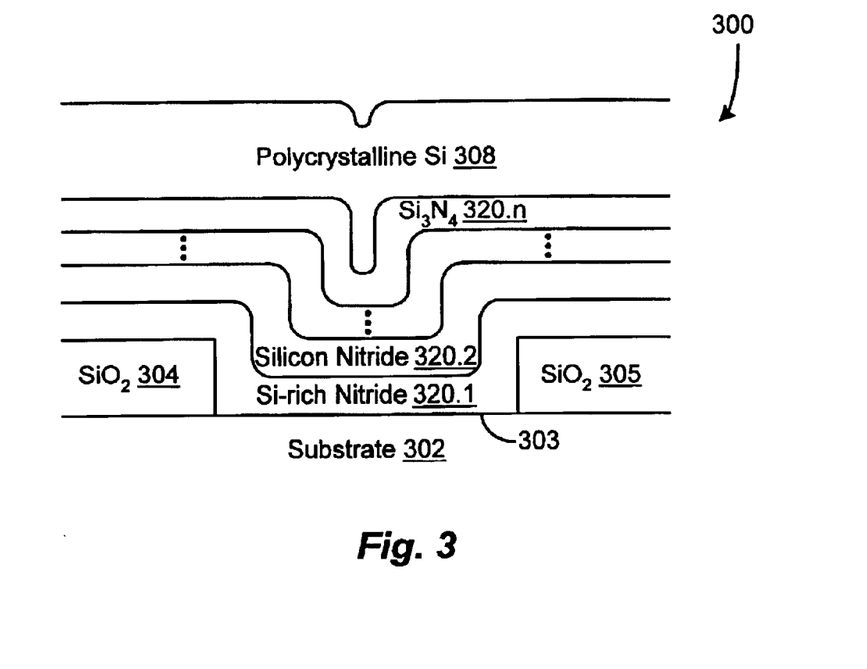
FIG. 3 is a schematic representation of a first alternative embodiment of the dielectric structure of FIG. 2.

FIG. 3 depicts a portion of a first alternative embodiment 300 of the MEMS device 200 (see FIG. 2). In the illustrated embodiment, the MEMS device 300 comprises a substrate 302, sacrificial layers 304–305, a dielectric layer including a composite stack having a plurality of silicon nitride sub-layers 320.1–320.n, and a structural layer 308. For example, the substrate 302 may comprise a silicon substrate, the sacrificial layers 304–305 may comprise $SiO_2$, and the structural layer 308 may comprise polysilicon.

As described above, the dielectric layer of the MEMS device 300 (see FIG. 3) includes the plurality of silicon nitride sub-layers 320.1–320.n. In the preferred embodiment, the silicon nitride sub-layer 320.1 deposited over the $SiO_2$ layers 304–305 and an anchor connection surface 303 of the substrate 302 comprises silicon-rich nitride, the silicon nitride sub-layer 320.n disposed adjacent the polysilicon layer 308 comprises stoichiometric silicon nitride ($Si_3N_4$), and the silicon nitride sub-layer(s) 320.2–320.n-1 disposed between the sub-layers 320.1 and 320.n have respective intermediate silicon contents.

For example, the ratio of silicon to nitrogen in the silicon-rich nitride sub-layer 320.1 may be approximately 0.85 like the silicon-rich nitride sub-layer 210 (see FIG. 2), and the silicon to nitrogen ratio in the $Si_3N_4$ sub-layer 320.n may be approximately 0.75 like the $Si_3N_4$ sub-layer 212 (see FIG. 2). Accordingly, the silicon to nitrogen ratio in the silicon nitride sub-layer(s) 320.2–320.n-1 (see FIG. 3) may be set to a suitable value(s) generally in the range of 0.75–0.85 by providing appropriate mixtures of $NH_3$ and DCS at compatible temperatures and pressures in the dielectric layer manufacturing process. In the preferred embodiment, the plurality of silicon nitride sub-layers 320.1–320.n provides successively reduced silicon content from the silicon-rich nitride sub-layer 320.1 to the stoichiometric $Si_3N_4$ sub-layer 320.n.

Figure 4:
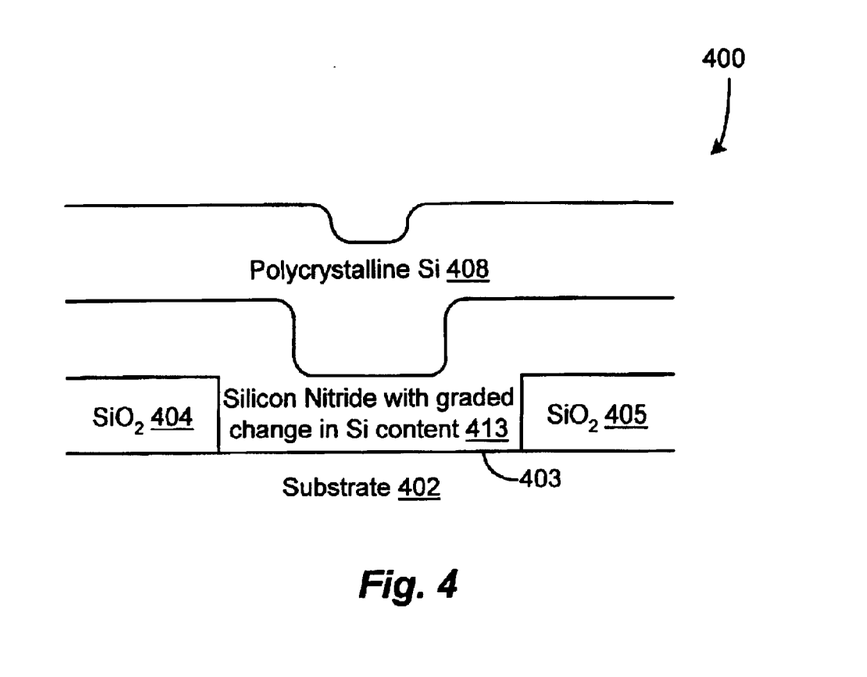
FIG. 4 is a schematic representation of a second alternative embodiment of the dielectric structure of FIG. 2.

FIG. 4 depicts a portion of a second alternative embodiment 400 of the MEMS device 200 (see FIG. 2). In the illustrated embodiment, the MEMS device 400 comprises a substrate 402, sacrificial layers 404–405, a dielectric layer 413, and a structural layer 408. Like the corresponding elements in the MEMS devices 200 and 300, the substrate 402 may comprise a silicon substrate, the sacrificial layers 404–405 may comprise $SiO_2$, and the structural layer 408 may comprise polysilicon.

Moreover, the dielectric layer 413 includes a single silicon nitride layer, which provides a graded change in silicon content from the $SiO_2$ layers 404–405 and an anchor connection surface 403 of the substrate 402, toward the polysilicon layer 408 of the MEMS device 400. In the preferred embodiment, the dielectric layer 413 comprises silicon-rich nitride near the respective boundaries of the $SiO_2$ layers 404–405 and the substrate 402. Further, the silicon content is gradually reduced through the single dielectric layer 413 from a level providing the silicon-rich nitride near the respective $SiO_2$ and substrate boundaries, to a level providing stoichiometric silicon nitride near the boundary of the polysilicon layer 408. For example, this may be achieved by suitably ramping the $NH_3$ and DCS gas flows to obtain the appropriate gas mixtures during the deposition process. Further, the dielectric layer 413 may be determined by depth profiling of the dielectric using X-ray Photoelectron Spectroscopy (XPS) to obtain suitable silicon to nitrogen ratios through the dielectric layer.

Figure 5:
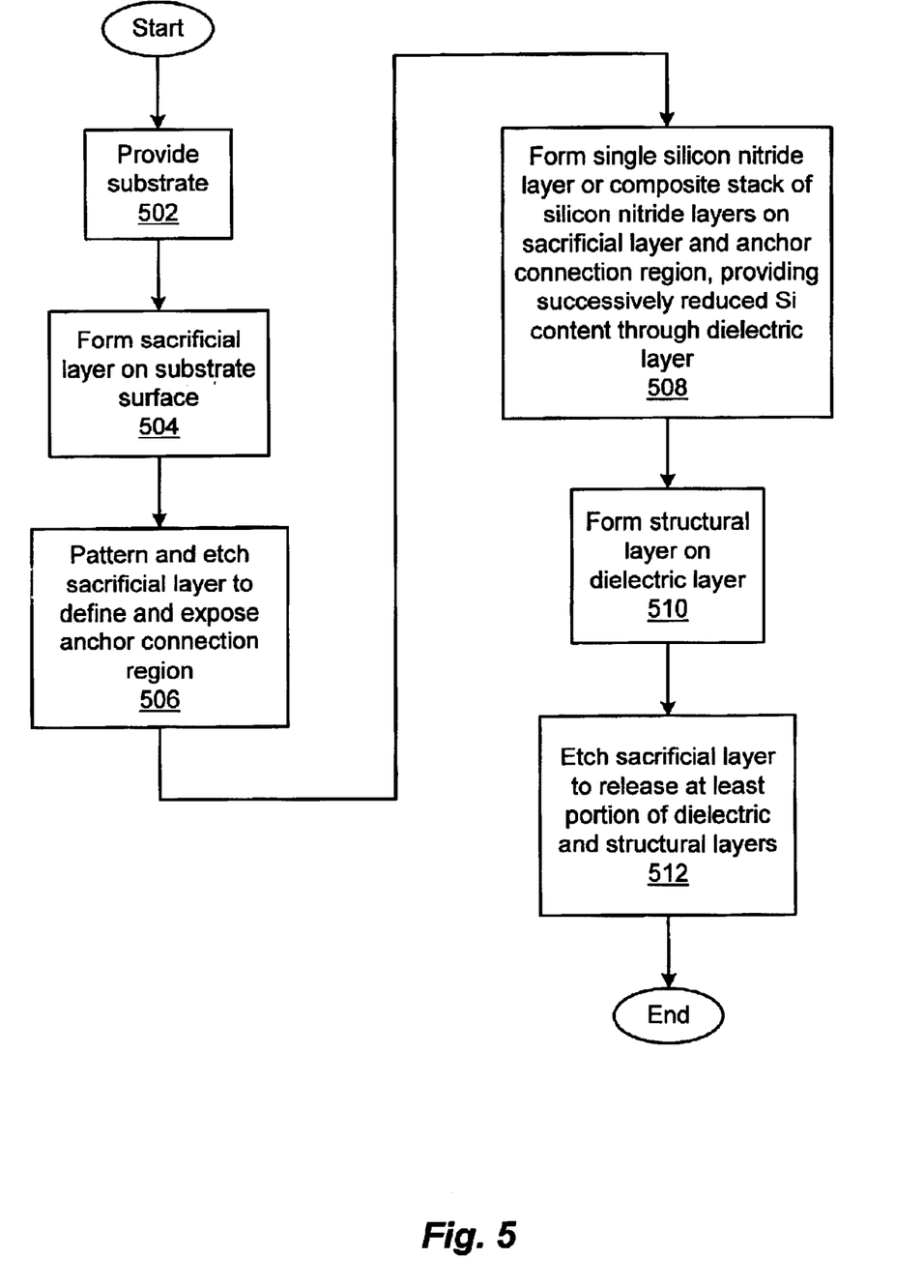
FIG. 5 is a flow diagram illustrating a method of manufacturing the dielectric structure of FIG. 2.

A method of manufacturing a MEMS structure or device according to the present invention is illustrated by reference to FIG. 5. As depicted in step 502, a substrate is provided. Next, a sacrificial layer is formed, as depicted in step 504, on a surface of the substrate. The sacrificial layer is then patterned and etched, as depicted in step 506, to define and expose a connection region for anchoring the MEMS structure to the substrate surface. Next, a dielectric layer comprising a single silicon nitride layer or a composite stack of silicon nitride layers is formed, as depicted in step 508, on the sacrificial layer and the anchor connection region to provide successively reduced silicon content through the dielectric layer—ranging from silicon-rich nitride at a first border region near the respective boundaries of the sacrificial layer and the anchor connection region, to stoichiometric silicon nitride at a second border region opposite the first border region. A structural layer is then formed, as depicted in step 510, over the dielectric layer adjacent the second border region. Finally, the sacrificial layer is etched away, as depicted in step 512, to release at least a portion of the dielectric and structural layers.

It should be appreciated that the above-described MEMS fabrication technique may be employed to make passivation films operative to protect MEMS devices against handling defects including packaging defects and scratches, thereby improving yield. Such passivation films may comprise a stack of silicon nitride layers, or a single silicon nitride layer providing a graded change in silicon content, to achieve high etch selectivity to HF acid and minimal electrical leakage at high voltage levels.

Figure 6:
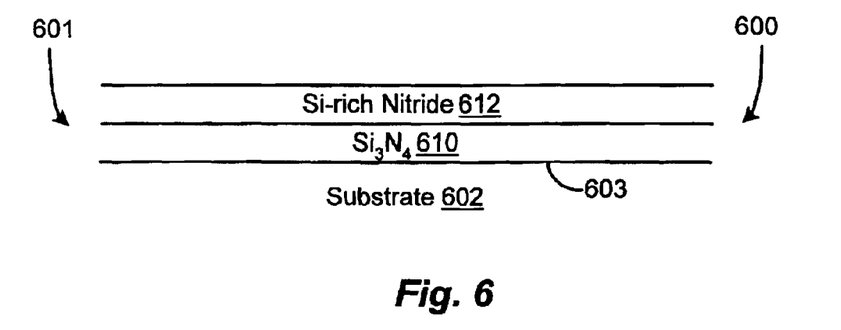
FIG. 6 is a schematic representation of a passivation film including a dielectric structure according to the present invention.

FIG. 6 depicts an illustrative embodiment of a passivation film structure 600, in accordance with the present invention. In the illustrated embodiment, the structure 600 comprises a substrate 602, and a passivation film 601 including a composite dielectric stack having a stoichiometric silicon nitride ($Si_3N_4$) sub-layer 610 and a silicon-rich nitride sub-layer 612.

In the preferred embodiment, the substrate 602 comprises a silicon substrate, however, it is understood that a substrate made of any suitable material may be employed. Further, each of the $Si_3N_4$ and silicon-rich nitride sub-layers 610 and 612 may be formed using the dielectric layer manufacturing process that was described above with reference to FIG. 2, with the exception that the $Si_3N_4$ sub-layer 610 is deposited on the substrate surface 603, and the silicon-rich nitride sub-layer 612 is deposited over the $Si_3N_4$ sub-layer 610 (i.e., the order of deposition of the $Si_3N_4$ and silicon-rich nitride sub-layers relative to the substrate is reversed). It is appreciated that the final thickness of the $Si_3N_4$ sub-layer 610 is sufficient to achieve minimal electrical leakage, while the final thickness of the silicon-rich nitride sub-layer 612 is sufficient to achieve optimal etch selectivity. Moreover, in alternative embodiments, one or more suitable semiconductor layers may be deposited over the passivation film 601.

Figure 7:
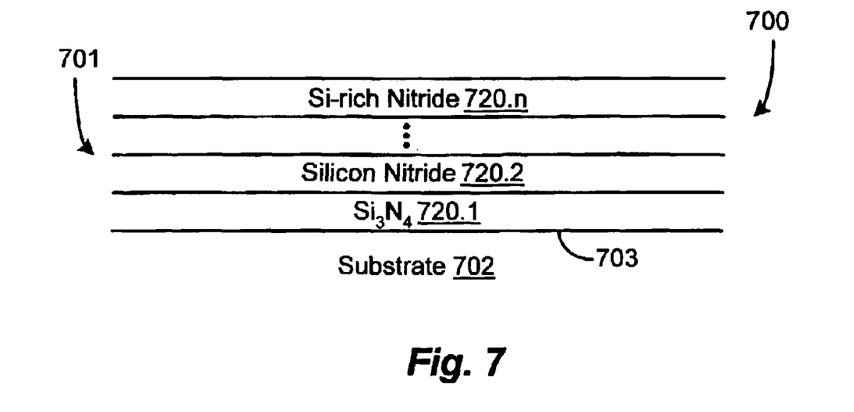
FIG. 7 is a schematic representation of a first alternative embodiment of the dielectric structure of FIG. 6.

FIG. 7 depicts a first alternative embodiment 700 of the passivation film structure 600 (see FIG. 6). In the illustrated embodiment, the structure 700 comprises a substrate 702, and a passivation film 701 including a composite stack having a plurality of silicon nitride sub-layers 720.1–720.n. In the preferred embodiment, the silicon nitride sub-layer 720.1 deposited on the substrate surface 703 comprises stoichiometric silicon nitride ($Si_3N_4$), the silicon nitride sub-layer 720.n comprises silicon-rich nitride, and the silicon nitride sub-layer(s) 720.2–720.n-1 disposed between the sub-layers 720.1 and 720.n have respective intermediate silicon contents. Specifically, the plurality of silicon nitride sub-layers 720.1–720.n provides successively reduced silicon content from the silicon-rich nitride sub-layer 720.n to the $Si_3N_4$ sub-layer 720.1.

Figure 8:
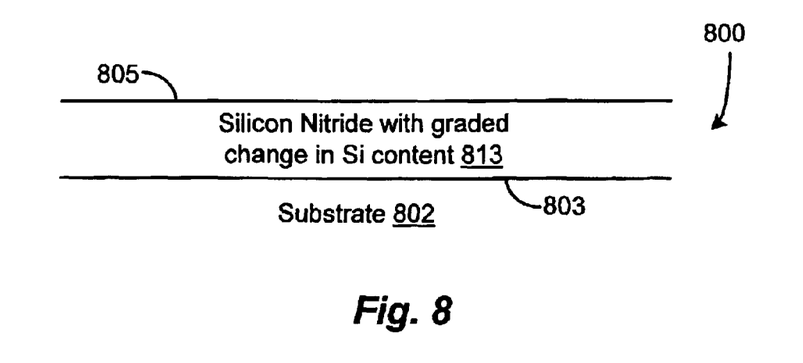
FIG. 8 is a schematic representation of a second alternative embodiment of the dielectric structure of FIG. 6.

FIG. 8 depicts a second alternative embodiment 800 of the passivation film structure 600 (see FIG. 6). In the illustrated embodiment, the structure 800 comprises a substrate 802, and a passivation film including a dielectric layer 813. In the preferred embodiment, the dielectric layer 813 includes a single silicon nitride layer, which provides a graded change in silicon content from the exposed dielectric boundary 805 toward the substrate surface 803. Specifically, the silicon content is gradually reduced through the single dielectric layer 813 from a level conforming to silicon-rich nitride at the dielectric boundary 805, to a level conforming to stoichiometric silicon nitride ($Si_3N_4$) at the substrate surface 803. For example, the dielectric layer 813 may be determined by depth profiling using X-ray Photoelectron Spectroscopy (XPS) to obtain suitable silicon to nitrogen ratios through the dielectric layer.

Figure 9:
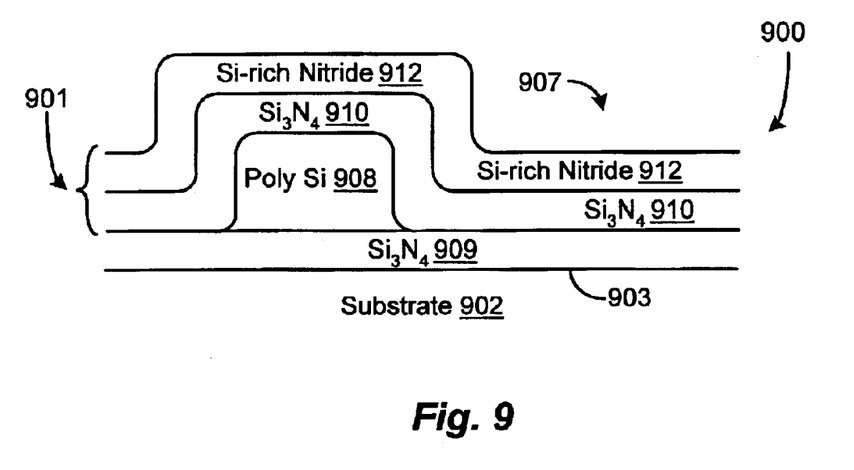
FIG. 9 is a schematic representation of the passivation film of FIG. 6 employed in a field region and in the vicinity of a structural layer of a semiconductor device.

FIG. 9 depicts a passivation film structure 900 employed within a field region 907, and near a structural layer (e.g., a polysilicon layer 908), of a MEMS device or any other suitable semiconductor device. In the illustrated embodiment, the structure 900 comprises a substrate 902, a stoichiometric silicon nitride ($Si_3N_4$) layer 909, and a passivation film 901 including an $Si_3N_4$ sub-layer 910 and a silicon-rich nitride sub-layer 912.

As shown in FIG. 9, the passivation film 901 is like the passivation film 601 (see FIG. 6). It should be understood, however, that the passivation film 901 may alternatively be configured like the passivation film 701 (see FIG. 7), or the passivation film 813 (see FIG. 8). Further, the $Si_3N_4$ layer 909 is deposited on the substrate surface 903, the polysilicon layer 908 is deposited over a portion of the $Si_3N_4$ layer 909, and the $Si_3N_4$ sub-layer 910 is deposited over the remaining $Si_3N_4$ layer 909 and over the polysilicon layer 908. In this way, the $Si_3N_4$ layers 909–910 can be made to surround the polysilicon layer 908, thereby minimizing electrical leakage in the vicinity of the layer 908. Moreover, the silicon-rich nitride sub-layer 912 is deposited over the $Si_3N_4$ sub-layer 910, thereby enhancing etch selectivity in the field region 907 and near the polysilicon layer 908.

Figure 10:
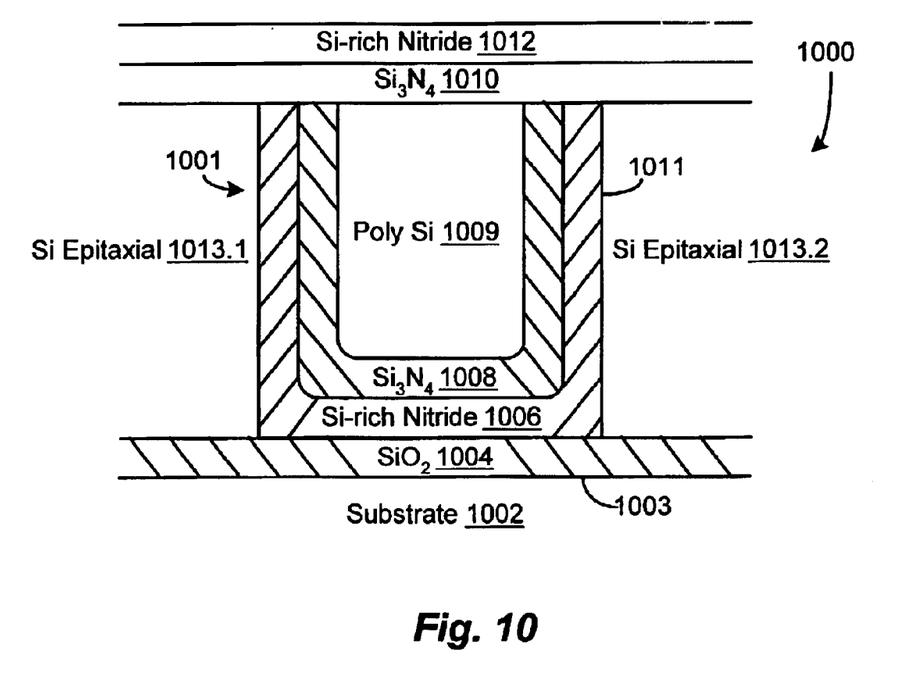
FIG. 10 is a cross-sectional view of a trench isolation structure including a trench lining dielectric according to the present invention.

FIG. 10 depicts a trench isolation structure 1000 having a trench lining dielectric 1001 configured like the passivation film 901 (see FIG. 9). In the illustrated embodiment, the structure 1000 comprises a substrate 1002, an optional silicon dioxide ($SiO_2$) layer 1004, silicon epitaxial layers or Silicon On Insulator (SOI) layers 1013.1–1013.2, and an isolation trench 1011 that extends within the boundaries of the silicon epitaxial layers 1013.1–1013.2 and the $SiO_2$ layer 1004 to electrically isolate the epitaxial layer 1013.1 from the epitaxial layer 1013.2.

In the preferred embodiment, the trench lining dielectric 1001 includes a silicon-rich nitride layer 1006 formed on the sidewalls of the silicon epitaxial layers 1013.1–1013.2 and on a portion of the surface of the $SiO_2$ layer 1004, and a stoichiometric silicon nitride ($Si_3N_4$) layer 1008 formed on the silicon-rich nitride layer 1006. A trench fill polysilicon layer 1009 occupies the remainder of the isolation trench 1011. It is noted that an $Si_3N_4$ layer 1010 may be optionally deposited over the isolation trench 1011 and the exposed surfaces of the silicon epitaxial layers 1012, and a silicon-rich nitride layer 1012 may be optionally deposited over the $Si_3N_4$ layer 1010.

Accordingly, the $Si_3N_4$ layers 1008 and 1010 surround the trench fill polysilicon layer 1009 to minimize electrical leakage, and the silicon-rich nitride sub-layers 1006 and 1012 are deposited over the respective $Si_3N_4$ sub-layers 1008 and 1010 to enhance etch selectivity, in the vicinity of the layer 1009. It is further noted that because the silicon-rich nitride sub-layer 1006 on the sidewalls of the epitaxial layers 1013.1–1013.2 is a reduced stress nitride, occurrences of slip defects in the trench isolation structure 1000 are reduced.

It is understood that the trench lining dielectric 1001 may alternatively comprise a composite stack having a plurality of silicon nitride sub-layers like the passivation film 701 (see FIG. 7) to provide successively reduced silicon content from the boundaries of the silicon epitaxial layers 1013.1–1013.2 and the buried $SiO2$ layer 1004 to the trench fill polysilicon layer 1009. In another alternative embodiment, the trench lining dielectric 1001 may comprise a single silicon nitride layer like the passivation film 813 (see FIG. 8) to provide a graded change in the silicon content from the silicon epitaxial layers 1013.1–1013.2 and the buried $SiO2$ layer 1004 to the trench fill polysilicon layer 1009.

It will further be appreciated by those of ordinary skill in the art that modifications to and variations of the above-described composite dielectric with improved etch selectivity for high voltage MEMS structures may be made without departing from the inventive concepts disclosed herein. Accordingly, the invention should not be viewed as limited except as by the scope and spirit of claims.

What is claimed is:

1. A semiconductor device, comprising:
   a substrate; and
   a semiconductor layer structure formed on the substrate, the semiconductor layer structure including at least one dielectric layer having a first border region and a second border region,
   wherein the dielectric layer exhibits increased etch selectivity characteristics at the first border region relative to the second border region, and exhibits increased electrical isolation characteristics at the second border region relative to the first border region, and
   wherein at least a portion of the dielectric layer is released from the substrate.

2. The device of claim 1 wherein the dielectric layer includes a plurality of dielectric sub-layers.

3. The device of claim 1 wherein the dielectric layer includes at least one silicon nitride sub-layer.

4. The device of claim 3 wherein the dielectric layer includes a single silicon nitride sub-layer providing a decreasing silicon content gradient from the first border region toward the second border region.

5. The device of claim 3 wherein the dielectric layer includes a composite stack of silicon nitride sub-layers providing successively reduced silicon content from the first border region toward the second border region.

6. The device of claim 5 wherein the composite stack includes a silicon-rich nitride sub-layer at the first border region and a stoichiometric silicon nitride sub-layer at the second border region.

7. The device of claim 1 wherein the semiconductor layer structure further includes a sacrificial layer and a structural layer, the dielectric layer being at least partially disposed between the sacrificial and structural layers, the sacrificial layer being adjacent the first border region of the dielectric layer, and the structural layer being adjacent the second border region of the dielectric layer.

8. The device of claim 1 wherein at least a portion of the second border region of the dielectric layer is disposed between the substrate and at least a portion of the first border region of the dielectric layer.

9. The device of claim 8 wherein the semiconductor layer structure further includes a structural layer disposed between the dielectric layer and the substrate.

10. The device of claim 8 wherein the dielectric layer is at least partially configured as a passivation layer.

11. The device of claim 1 wherein at least a portion of the first border region of the dielectric layer is disposed between the substrate and at least a portion of the second border region of the dielectric layer.

12. The device of claim 1 wherein the dielectric layer is anchored to the substrate.

13. The device of claim 1 wherein the released portion of the dielectric layer is substantially a uniform distance from the substrate.

14. A semiconductor device, comprising:
    a substrate; and
    a semiconductor layer structure formed on the substrate, the semiconductor layer structure including at least one dielectric layer having a first border region and a second border region,
    wherein the dielectric layer exhibits increased etch selectivity characteristics at the first border region relative to the second border region, and exhibits increased electrical isolation characteristics at the second border region relative to the first border region,
    wherein the dielectric layer includes a composite stack of silicon nitride sub-layers providing successively reduced silicon content from the first border region toward the second border region,
    wherein the composite stack includes a silicon-rich nitride sub-layer at the first border region and a stoichiometric silicon nitride sub-layer at the second border region, and
    wherein the composite stack further includes at least one silicon nitride sub-layer disposed between the silicon-rich nitride sub-layer and the stoichiometric silicon nitride sub-layer.

15. A semiconductor device, comprising:
    a substrate; and
    a semiconductor layer structure formed on the substrate, the semiconductor layer structure including at least one dielectric layer having a first border region and a second border region,
    wherein the dielectric layer exhibits increased etch selectivity characteristics at the first border region relative to the second border region, and exhibits increased electrical isolation characteristics at the second border region relative to the first border region, and
    wherein the dielectric layer is configured as a trench lining dielectric.

* * * * *

UNITED STATES PATENT AND TRADEMARK OFFICE
CERTIFICATE OF CORRECTION

PATENT NO. : 6,747,338 B1 Page 1 of 1
DATED : June 8, 2004
INVENTOR(S) : Thomas K. Nunan et al.

It is certified that error appears in the above-identified patent and that said Letters Patent is hereby corrected as shown below:

Column 9,
Line 7, "of claims." should read -- of the appended claims. --.

Signed and Sealed this

Twenty-fourth Day of May, 2005

JON W. DUDAS
*Director of the United States Patent and Trademark Office*